United States Patent
Liao et al.

(10) Patent No.: US 9,401,280 B2
(45) Date of Patent: Jul. 26, 2016

(54) SEMICONDUCTOR PROCESS

(71) Applicant: UNITED MICROELECTRONICS CORP., Hsin-Chu (TW)

(72) Inventors: Duan Quan Liao, Singapore (SG); Wei Cheng, Singapore (SG); Yikun Chen, Singapore (SG); Ching Hwa Tey, Singapore (SG); Xiao Zhong Zhu, Singapore (SG)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 13 days.

(21) Appl. No.: 14/288,399

(22) Filed: May 28, 2014

(65) Prior Publication Data

US 2015/0348789 A1    Dec. 3, 2015

(51) Int. Cl.
*H01L 21/28*    (2006.01)
*H01L 27/115*    (2006.01)

(52) U.S. Cl.
CPC .... *H01L 21/28273* (2013.01); *H01L 27/11521* (2013.01); *H01L 27/11534* (2013.01)

(58) Field of Classification Search
None
See application file for complete search history.

(56) References Cited

U.S. PATENT DOCUMENTS

| | | | |
|---|---|---|---|
| 4,795,722 A | 1/1989 | Welch | |
| 4,838,991 A * | 6/1989 | Cote et al. | 216/46 |
| 6,593,187 B1 | 7/2003 | Hsieh | |
| 7,518,912 B2 | 4/2009 | Hung | |
| 2008/0049517 A1* | 2/2008 | Hung | G11C 16/0433 365/185.28 |
| 2008/0233728 A1* | 9/2008 | Hosoda et al. | 438/593 |
| 2009/0186459 A1* | 7/2009 | Chen | 438/261 |

* cited by examiner

*Primary Examiner* — Charles Garber
*Assistant Examiner* — Stanetta Isaac
(74) *Attorney, Agent, or Firm* — Winston Hsu; Scott Margo

(57) ABSTRACT

A semiconductor process includes the following steps. A first gate is formed on a substrate, wherein the first gate includes a stacked gate on the substrate and a cap on the stacked gate. A spacer material is formed to conformally cover the first gate and the substrate. The spacer material is etched to form a spacer on a side of the first gate and a block on the other side of the first gate corresponding to the side. A material covers the substrate, the block, the first gate and the spacer, wherein the top surface of the material is a flat surface. The block, the spacer and the material are pulled down with the same pulling selectivity so that an assisting gate is formed from the block and a selective gate is formed from the spacer.

18 Claims, 6 Drawing Sheets

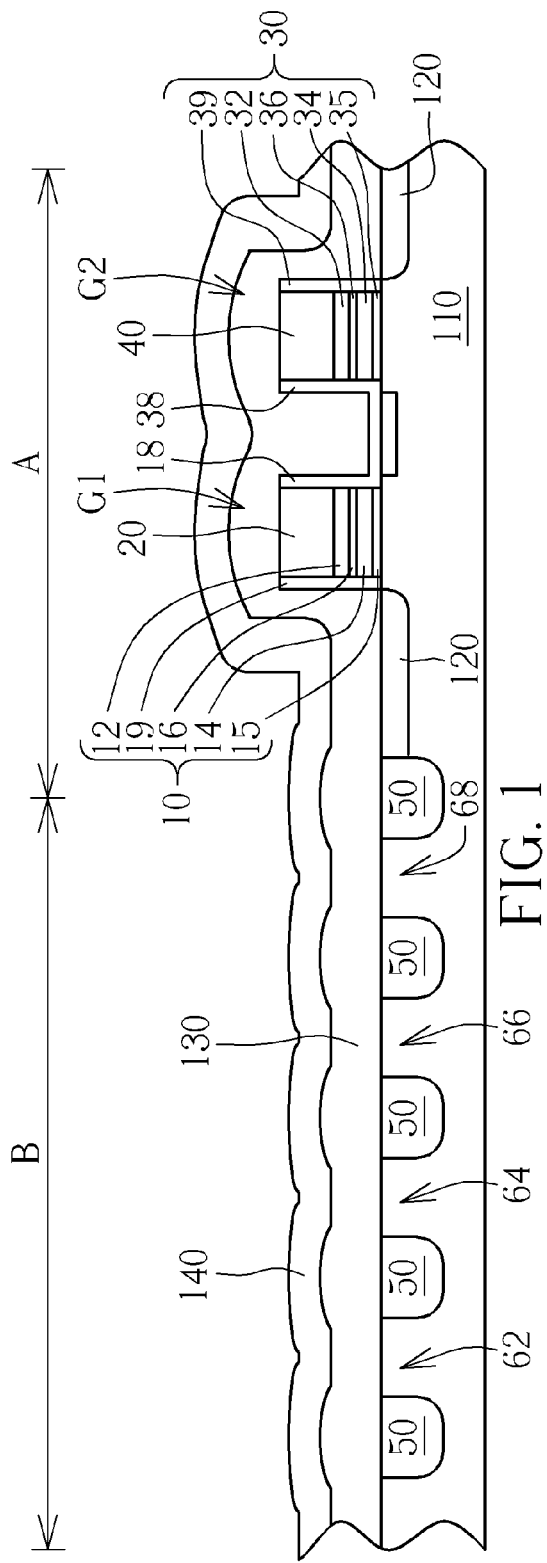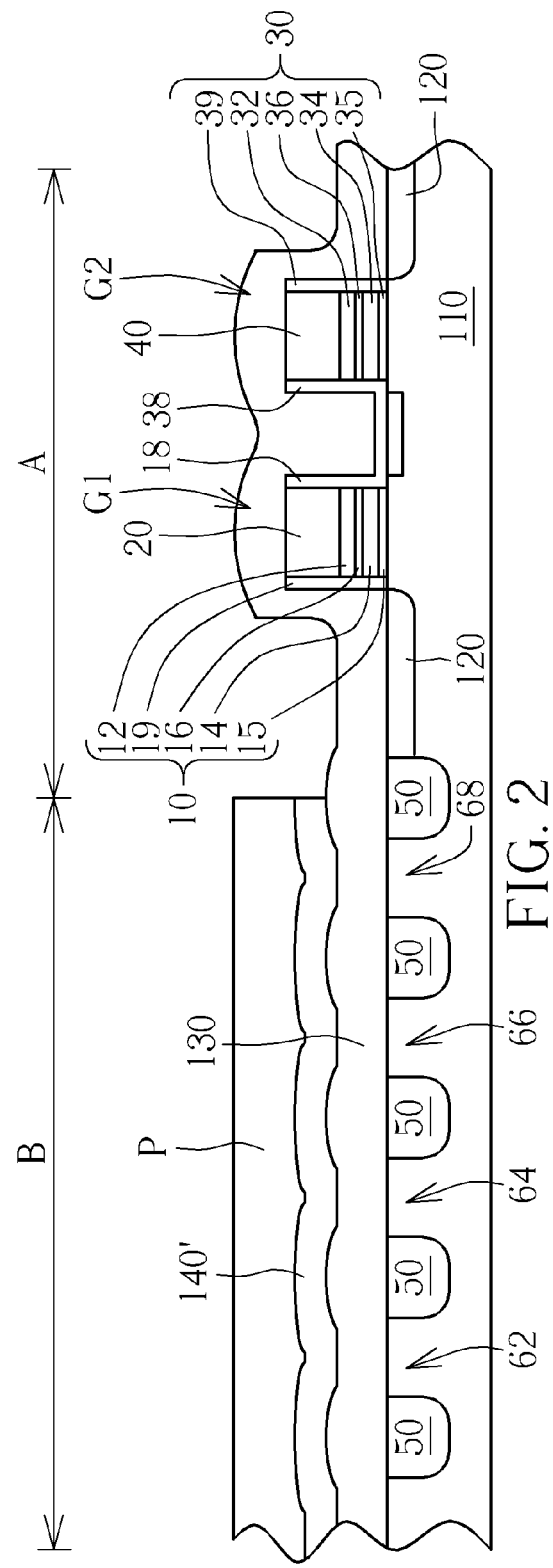

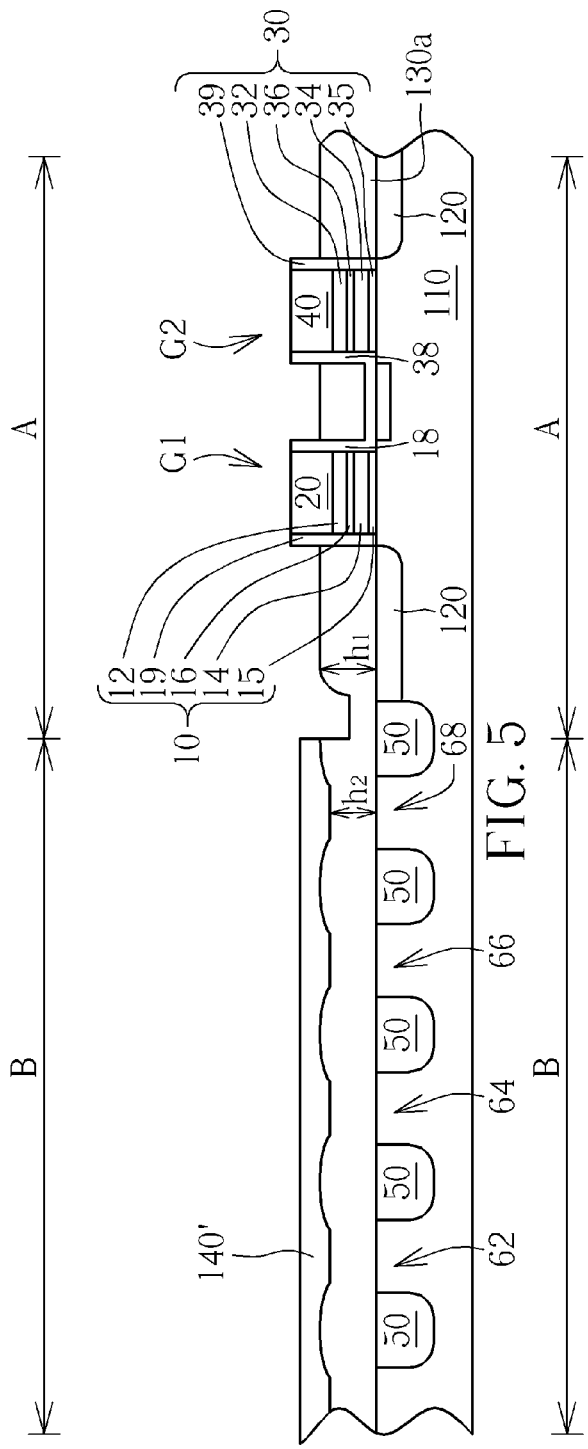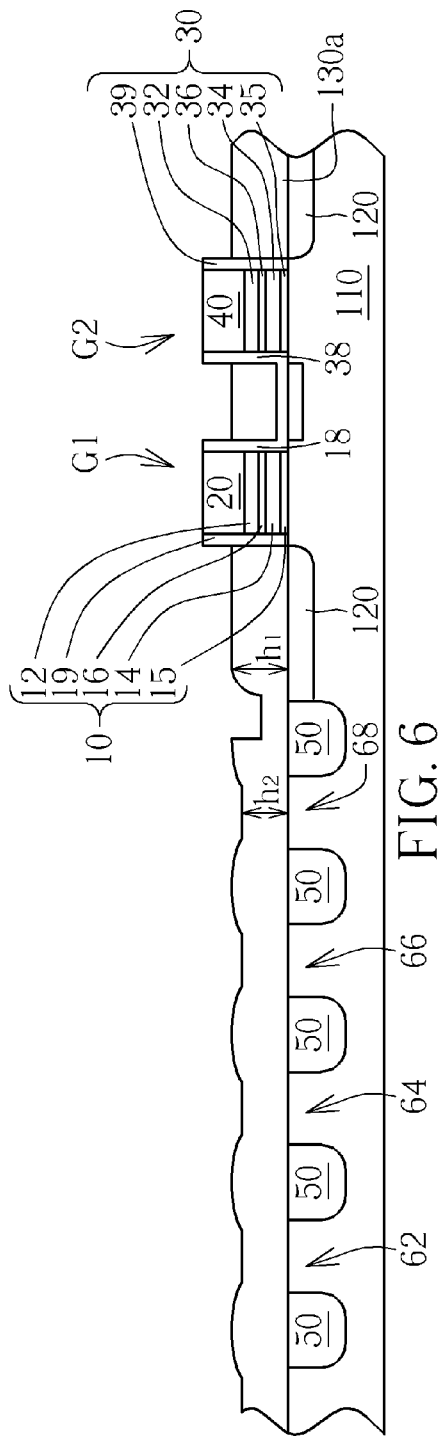
FIG. 5
FIG. 6

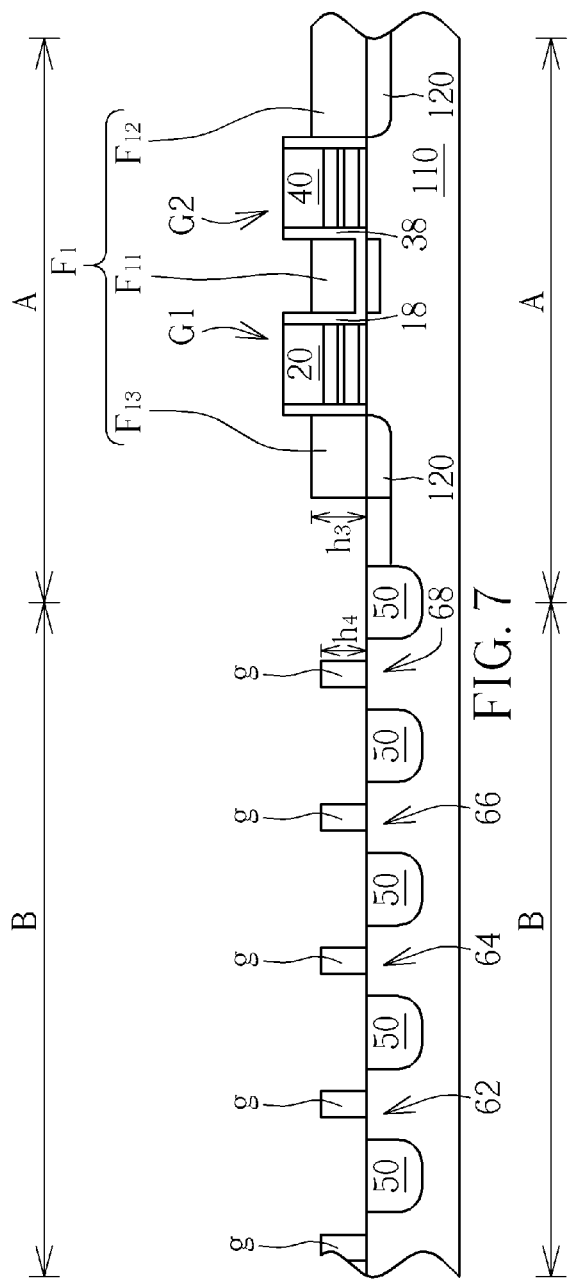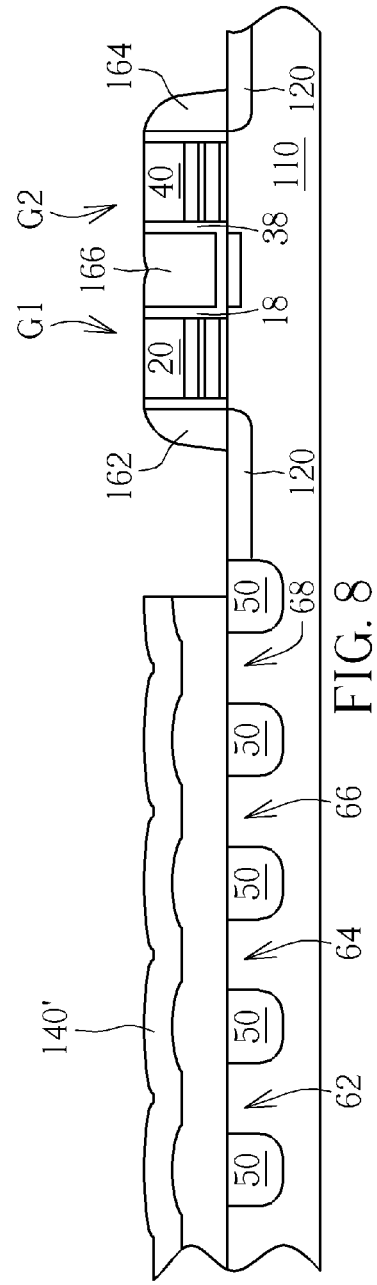

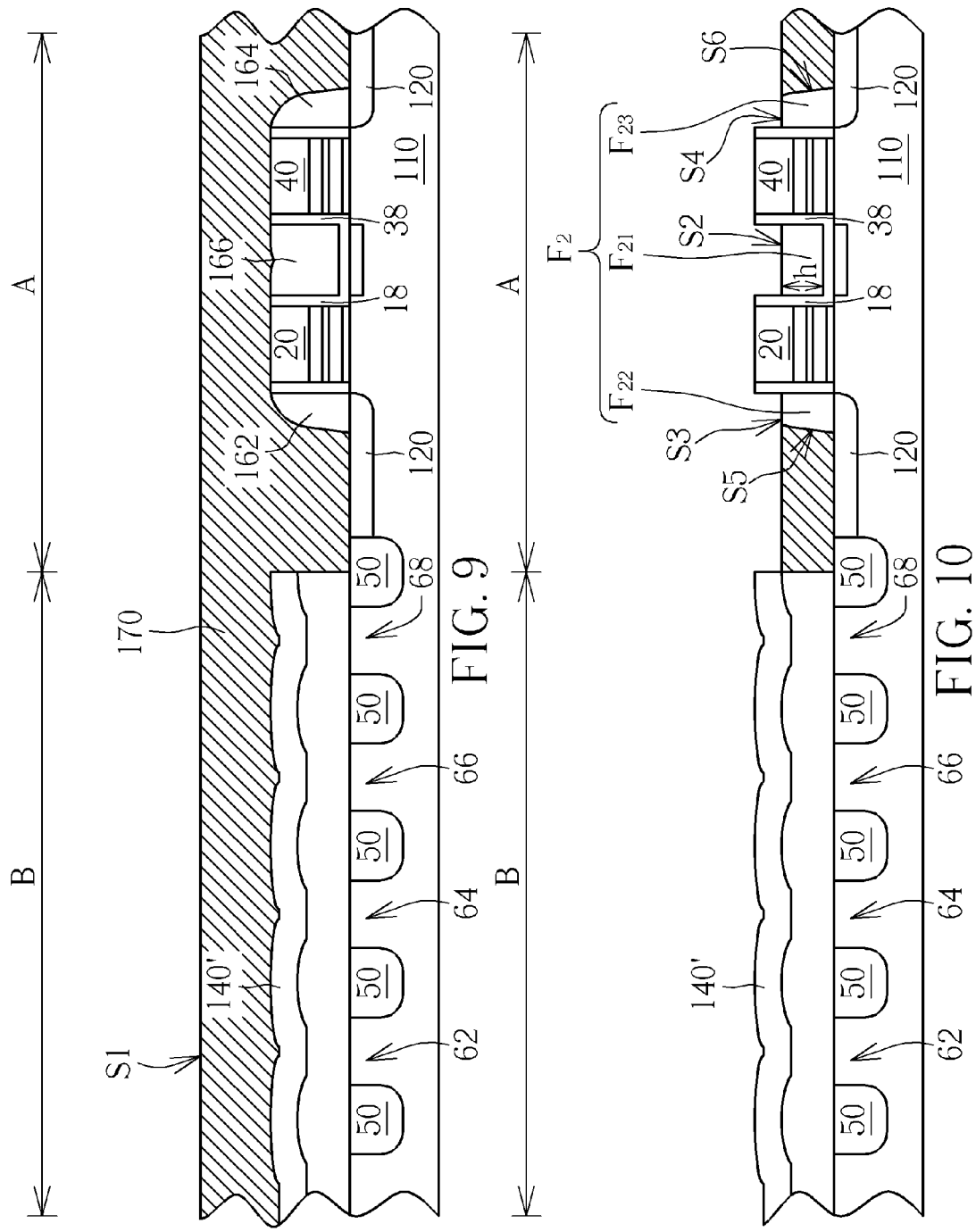

SEMICONDUCTOR PROCESS

BACKGROUND OF THE INVENTION

1. Field of the Invention

The present invention relates generally to a semiconductor process, and more specifically to a semiconductor process, which applies materials that fill gaps in order to pull down spacers.

2. Description of the Prior Art

Communication of mass information is a regular part of modern life. Memory devices that access information are essential for managing such information efficiently. Flash memory, with its advantages of low power consumption, high-speed operation, being readable/writable, non-volatile, and requiring no mechanical operations, has been widely applied to personal computers and electronic apparatus, as operations of data writing, reading, and erasing can be performed repeatedly on a non-volatile memory device and the data stored therein will not be lost even when a power supply is turned off.

Flash memory includes a plurality of memory units, wherein each memory unit includes a specially made MOS (Metal-Oxide-Semiconductor) transistor. Each transistor includes a stacked gate having a floating gate and a control gate fabricated thereon. The control gate is disposed on the floating gate directly, the floating gate and the control gate are isolated by a dielectric layer, and the floating gate and the substrate are isolated by a tunneling oxide (this is known as a stacked gate flash memory). The transistor may have other assisting gates besides the floating gate and the control gate, and the memory unit may be integrated with transistors of logic units. Fabricating transistors which have assisting gates of uniform height, and integrating memory units with other functional units such as logical units is an important issue in the field.

SUMMARY OF THE INVENTION

The present invention therefore provides a semiconductor process, which applies materials such as organic materials to fill space next to spacers for pulling them down to a uniform height. The spacers can thereby form functional structures such as assisting gates or selective gates.

The present invention provides a semiconductor process including the following steps. A first gate is formed on a substrate, wherein the first gate includes a stacked gate on the substrate and a cap on the stacked gate. A spacer material is formed to conformally cover the first gate and the substrate. The spacer material is etched to form a spacer on a side of the first gate and a block on the other side of the first gate corresponding to the side. A material covers the substrate, the block, the first gate and the spacer, wherein the top surface of the material is a flat surface. The block, the spacer and the material are pulled down with the same pulling selectivity to the block, the spacer and the material, so that an assisting gate is formed from the block, and a selective gate is formed from the spacer.

According to the above, the present invention provides a semiconductor process, which applies a material having a flat top surface to fill space beside a spacer for pulling down the spacers, so that the spacer can have a flat top surface. It is emphasized that the spacer and the material must have the same pulling selectivity to enable the spacer to have a flat top surface.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 schematically depict a cross-sectional view of a semiconductor process according to a first embodiment of the present invention.

FIGS. 8-11 schematically depict a cross-sectional view of a semiconductor process according to a second embodiment of the present invention.

DETAILED DESCRIPTION

Figure 3:
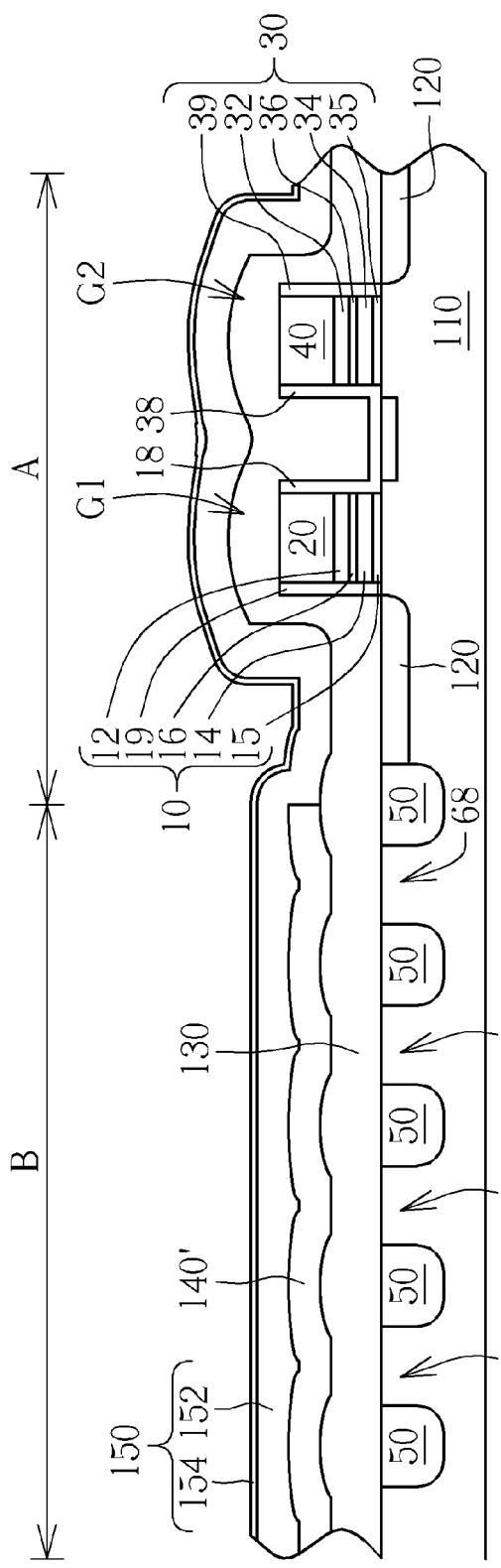

The present invention applies to a multi-level non-volatile memory device including two gates which are symmetric to each other in the following embodiments, but the present invention is not restricted thereto. The present invention may be applied to a non-volatile memory device only having one gate, or to other devices. A multi-level non-volatile memory device can simplify the manufacturing flow, thereby reducing the manufacturing cost and increasing the integration of a device at the same time.

FIGS. 1-7 schematically depict a cross-sectional view of a semiconductor process according to a first embodiment of the present invention. In Step 1, as illustrated in FIG. 1, a substrate 110 having a first area A and a second area B is provided. In this embodiment, a flash cell process is integrated with a logic cell process, so that the first area A is a flash memory area while the second area B is a logic area, but it is not limited thereto. In another embodiment, the first area A is a flash memory area and the second area B may be other areas. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers such as a P-type substrate having a P-type epitaxial layer with a thickness of 2.5 micrometers, but is not limited thereto.

In the first area A, a first gate G1 and a second gate G2 are formed on the substrate 110. In this embodiment, the first gate G1 is the same as the second gate G2, but it is not limited thereto. The first gate G1 includes a stacked gate 10 on the substrate 110 and a cap 20 on the stacked gate 10 while the second gate G2 includes a stacked gate 30 on the substrate 110 and a cap 40 on the stacked gate 30. The stacked gates 10/20 may include polysilicon gates and the caps 20/40 may be composed of nitride, but not limited thereto.

In this embodiment, the stacked gate 10 of the first gate G1 may include a control gate 12 on the substrate 110, and a charge storage gate 14 between the substrate 110 and the control gate 12. Likewise, the stacked gate 30 of the second gate G2 may include a control gate 32 on the substrate 110, and a charge storage gate 34 between the substrate 110 and the control gate 32. The control gates 12/32 and the charge storage gates 14/34 may include polysilicon gates; and especially doped polysilicon gates. The charge storage gates 14/34 may also include other charge-trapping material such as silicon nitride, silicon oxynitride, tantalum oxide, strontium titanate, or hafnium oxide.

The stacked gate 10 may further include a first dielectric layer 15 between the charge storage gate 14 and the substrate 110 and a second dielectric layer 16 between the control gate 12 and the charge storage gate 14. The stacked gate 30 may further include a first dielectric layer 35 between the charge storage gate 34 and the substrate 110 and a second dielectric layer 36 between the control gate 32 and the charge storage gate 34. Moreover, the first gate G1 and the second gate G2 may include a third dielectric layer 18/38 between the two, which contacts both gates so that they form one piece. The first gate G1 and the second gate G2 may both include a fourth dielectric layer 19/39 at one side, respectively, corresponding to the side of the third dielectric layer 18/38. The first dielectric layers 15/35, the second dielectric layers 16/36, the third dielectric layers 18/38 and the fourth dielectric layers 19/39 may be composed of silicon oxide, silicon nitride, etc. Furthermore, a doped region 120 may be formed in the substrate 110 beside one side of the first gate G1 and the second gate G2. The doped region 120 may be a lightly doped source/drain, a source/drain region or a lightly doped source/drain overlapping a source/drain region, depending upon requirements. The methods of forming the first gate G1, the second gate G2 and the doped region 120 are well-known in the arts.

In the second area B, isolation structures 50 may be formed in the substrate 110 for isolating several active areas 62/64/66/68 from each other. The substrate 110 of these active areas 62/64/66/68 may be doped individually according to their functions. Components such as logic transistors may be formed in these active areas 62/64/66/68 simultaneously or individually.

Thereafter, a spacer material 130 conformally covers the first area A and the second area B. A cap layer 140 may conformally cover the spacer material 130. In this embodiment, the spacer material 130 is composed of polysilicon while the cap layer 140 is composed of oxide, but it is not limited thereto. The spacer material 130 and the cap layer 140 are composed of different materials, so that the cap layer 140 can serve as a hard mask for etching in the following processing steps.

In Step 2, as shown in FIG. 2, the cap layer 140 is patterned by methods such as a lithography process. More precisely, a photoresist (not shown) is deposited and patterned to form a patterned photoresist P, so the first area A is exposed. Then, the cap layer 140 in the first area A can be removed by methods such as etching, so that the cap layer 140' remains and the spacer material 130 in the first area A is exposed. Thereafter, the patterned photoresist P is removed.

In Step 3, as shown in FIG. 3, a dummy material 150 is formed to cover the spacer material 130 in the first area A and the cap layer 140' in the second area B. In this embodiment, the dummy material 150 is composed of a dual layer including a dummy polysilicon layer 152 and an oxide layer 154 from bottom to top, but it is not limited thereto. Preferably, the spacer material 130 and the dummy polysilicon layer 152 are composed of the same material for forming one part of a later formed functional device if the dummy polysilicon layer 152 is not removed completely in later processes.

Figure 4:
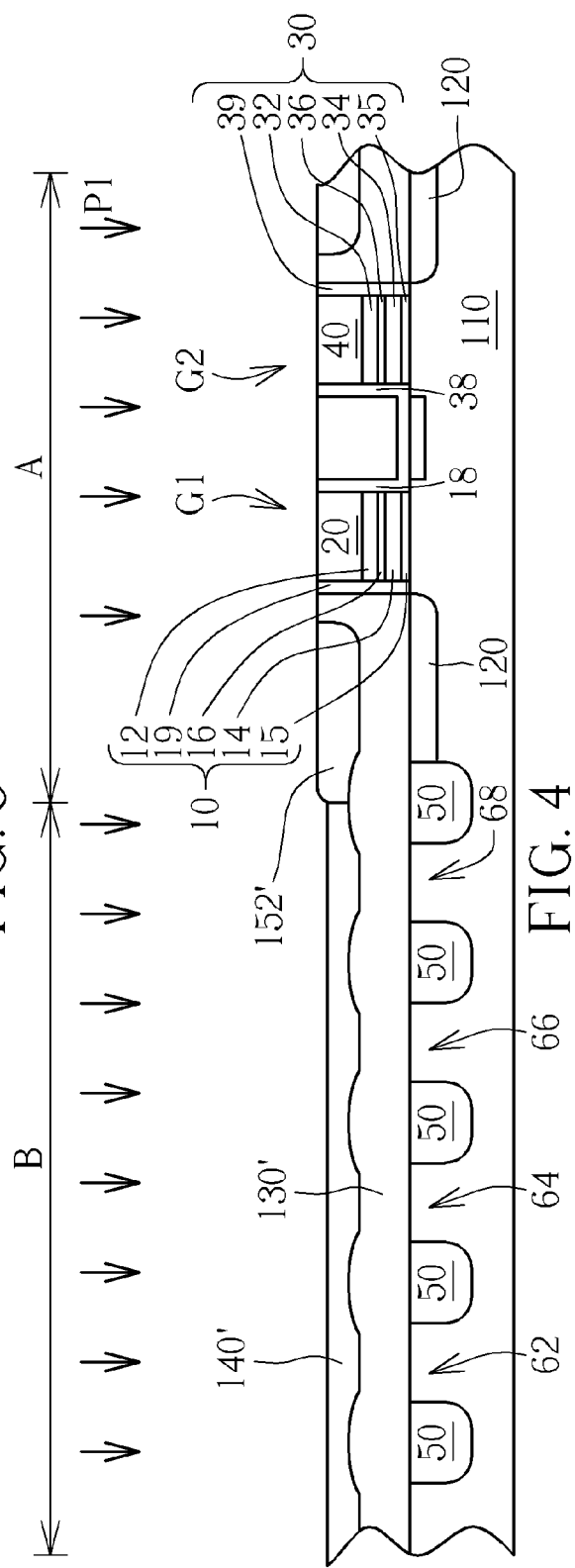

In Step 4, a planarization process P1 may be performed to planarize the dummy material 150 and the spacer material 130 and stop on the cap layer 140' in the second area B and the caps 20/40 in the first area A, as shown in FIG. 4. The planarization process P1 may be a chemical mechanical polishing (CMP) process, but it is not limited thereto. In this embodiment, the oxide layer 154 is removed completely while a dummy polysilicon layer 152' and a spacer material 130' remain.

In Step 5, only the spacer material 130' in the first area A is etched by using the cap layer 140' as a hard mask, so that a spacer material 130a is formed, as shown in FIG. 5. Preferably, the spacer material 130a in the first area A has the same height h1 as the height h2 of the spacer material 130a in the second area B for integrating processing of the first area A and the second area B.

In Step 6, the cap layer 140' is removed, as shown in FIG. 6. The cap layer 140' may be removed by methods such as etching. Preferably, the cap layer 140' is removed by a wet etching process having an etchant of dilute hydrofluoric acid (DHF), so the cap layer 140' can be removed completely while the spacer material 130a is reserved without consumption.

In Step 7, the spacer material 130a in the first area A and the second area B are all etched, as shown in FIG. 7. Thereby, gates g in the second area B are formed while a flash memory cell F1 including an assisting gate F11 and two selective gates F12/13 is formed. The assisting gate F11 is formed between the first gate G1 and the second gate G2. The selective gates F12/13 are respectively formed on either side of both the first gate G1 and the second gate G2 corresponding to the assisting gate F11. The assisting gate F11 and the selective gates F12/13 are all doped polysilicon gates in this embodiment, but they are not limited thereto. The gates g in the second area B can serve to form logic transistors, high-voltage transistors, etc. in these active areas 62/64/66/68, depending upon requirements.

According to the above, a flash memory cell can be integrated with a logic cell by applying the aforesaid process. The processing steps of the embodiment described above are complex and may cause problems. For example, when a lithography process is performed in Step 2 to pattern the cap layer 140 and expose the spacer material 130, misalignment of the patterned photoresist P may occur, which may lead to misalignment of the spacer material 130; in step 4, performing a polishing process such as a chemical mechanical polishing (CMP) process leads to high processing costs and may result in non-uniformity of the spacer material 130' in the center of a wafer and in the edge of the wafer. Loading effects may therefore occur in the boundary of the first area A and the second area B, which may result in non-uniformity of the spacer material 130'; in step 5, only the spacer material 130' in the first area A is etched by using the cap layer 140' as a hard mask, which may cause asymmetry of the spacer material 130a in the first area A and in the second area B. The above defects mean the assisting gate F11 and the selective gates F12/13 may have different heights and will not be uniform.

Thus, a second embodiment of a semiconductor process is presented in the following to solve the aforesaid problems. FIGS. 8-11 schematically depict a cross-sectional view of a semiconductor process according to a second embodiment of the present invention.

The previous processing steps of the embodiment are the same as the processing steps shown in FIGS. 1-2: a substrate 110 having a first area A and a second area B is provided; a first gate G1 and a second gate G2 are formed on the substrate 110 of the first area A, wherein the first gate G1 and the second gate G2 have the same structures, the first gate G1 includes a stacked gate 10 on the substrate 110 and a cap 20 on the stacked gate 10 and the second gate G2 includes a stacked gate 30 on the substrate 110 and a cap 40 on the stacked gate 30; a doped region 120 may be formed in the substrate 110 at one side of the first gate G1 and the second gate G2; a spacer material 130 and a cap layer 140 cover the first gate G1, the second gate G2 and the substrate 110 in the first area A and the second area B sequentially; and the cap layer 140 is patterned to expose the spacer material 130 in the first area A and reserve the cap layer 140' in the second area B. The materials of these components and the forming methods thereof are similar to the first embodiment, and thus are not described herein.

The patterned photoresist P shown in FIG. 2 may be removed, and the spacer material 130 in the first area A is etched by using the oxide layer 140' as a hard mask to form a spacer 162 on a side of the first gate G1, a spacer 164 on a side of the second gate G2 and a block 166 between the first gate G1 and the second gate G2, as shown in FIG. 8. The patterned photoresist P may be removed before the spacer material 130 in the first area A is etched to form the spacer 162, the spacer 164 and the block 166; or, the patterned photoresist P may be removed after the spacer material 130 in the first area A is etched to form the spacer 162, the spacer 164 and the block 166, depending upon processing requirements. In this embodiment, the caps 20/40 are composed of nitride while the spacer material 130 is composed of polysilicon, thus the caps 20/40 can be exposed while the spacers 162/164 and the block 166 are formed.

As shown in FIG. 9, a material 170 covers the substrate 110 of the first area A and the second area B, the spacer 162/164, the block 166, the first gate G1 and the second gate G2 entirely. It is emphasized that the top surface S1 of the material 170 must be a flat surface for pulling down the spacer material 130 in the first area A to form an assisting gate and selective gates being of uniform height. Thus, the material 170 preferably includes a photo resistor or an organic material such as organic BARC (bottom anti-reflective coating) or silicon on glass (SOG), etc., and is preferably formed by coating in order to obtain a flat top surface S1. In addition, the material 170 may be organic dielectric layer (ODL), near-frictionless carbon (NFC) or light absorbing oxide (DUO) or etc. Furthermore, the material 170, the spacers 162/164 and the block 166 preferably include different materials for removing the material 170 easily in later processes.

Thereafter, the spacers 162/164, the block 166 and the material 170 are pulled down by the same pulling selectivity, so an assisting gate F21 and selectivity gates F22/F23 of uniform height h can be formed, as shown in FIG. 10. Preferably, the spacers 162/164, the block 166 and the material 170 are pulled down by an etching process having the same etching selectivity. This means the etching rate of the spacers 162/164 and the block 166 is the same as the etching rate of the material 170. Preferably, the etching process is a dry etching process such as an anisotropic etching, which vertically etches the spacers 162/164 without causing lateral damage. The assisting gate F21 has a flat top surface S2. The selective gates F22/F23 all have flat top surfaces S3/S4 which are lower than the caps 20/40 and boat-shaped sidewalls S5/S6.

Figure 11:
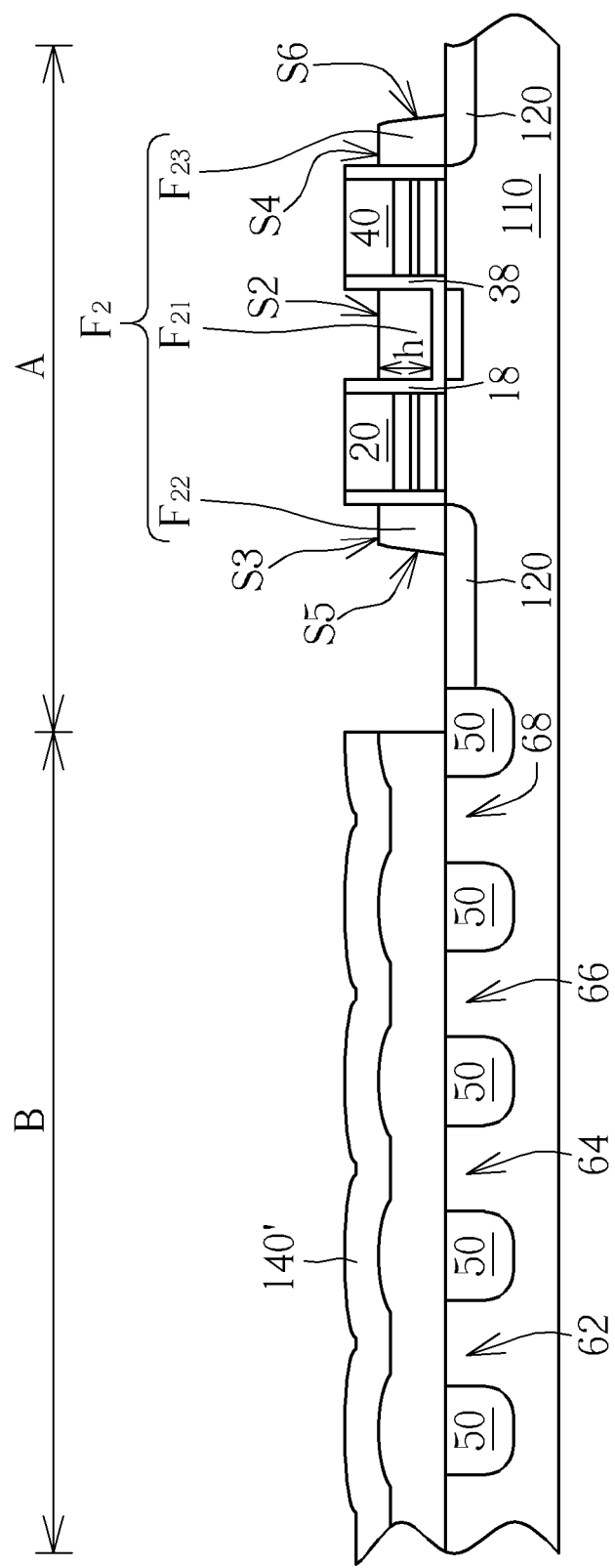

The material 170 may be optionally removed, as shown in FIG. 11. The material 170 may be removed by an oxygen containing process. Preferably, the material 170 may be removed by an O2 plasma process, so the material 170 can be removed completely without damaging the spacers 162/166 and the block 166.

To summarize, the present invention provides a semiconductor process, which applies a material having a flat top surface to fill gaps beside spacers for pulling down these spacers, so that the spacers can be of uniform height. It is emphasized that the spacers and the material must have the same pulling selectivity to enable the spacers having uniform heights. Preferably, the material includes an organic material, which is formed by coating, so that the material can have a flat top surface. The method of pulling down the spacers and the material may be by performing an etching process, which is preferably a dry etching process such as a non-isotropic etching, in order to vertically etch the spacers without causing lateral damage.

The material and the spacers may have different materials for ease of removing the material. The material may be removed by an oxygen containing process, which is preferably an O2 plasma process to remove the material completely without consuming the spacers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
    forming a first gate on a substrate, wherein the first gate comprises a stacked gate on the substrate and a cap on the stacked gate;
    forming a spacer material to conformally cover the first gate and the substrate;
    etching the spacer material to form a spacer on a side of the first gate and a block on the other side of the first gate corresponding to the side, wherein the block and the spacer are made of the spacer material;
    covering a material on the substrate, the block, the first gate and the spacer, wherein the top surface of the material is a flat surface; and
    pulling down the block, the spacer and the material with the same pulling selectivity, thereby forming an assisting gate from the block, and a selective gate from the spacer, wherein the assisting gate and the selective gate are of substantially uniform height, and top surfaces of the assisting gate and the selective gate are lower than a top surface of the first gate.

2. The semiconductor process according to claim 1, wherein the stacked gate comprises a control gate on the substrate, and a charge storage gate between the substrate and the control gate.

3. The semiconductor process according to claim 2, wherein the first gate further comprises a first dielectric layer between the charge storage gate and the substrate, a second dielectric layer between the control gate and the charge storage gate, a third dielectric layer between the assisting gate, the control gate, the charge storage gate and the substrate, and a fourth dielectric layer between the selective gate, the control gate, the charge storage gate and the substrate.

4. The semiconductor process according to claim 1, further comprising:
    forming a doped region in the substrate at the side of the first gate after the first gate is formed.

5. The semiconductor process according to claim 1, wherein the stacked gate comprises polysilicon gate.

6. The semiconductor process according to claim 1, wherein the spacer material comprises polysilicon.

7. The semiconductor process according to claim 1, wherein the material and the spacer comprise different materials.

8. The semiconductor process according to claim 7, wherein the material comprises an organic material, a photo resistor, an organic BARC (bottom anti-reflective coating) or silicon on glass (SOG).

9. The semiconductor process according to claim 8, wherein the method of covering the material comprises coating.

10. The semiconductor process according to claim 1, wherein the block, the spacer and the material are pulled down by a dry etching process.

11. The semiconductor process according to claim 10, wherein the dry etching process has the same etching selectivity to the block, the spacer and the material.

12. The semiconductor process according to claim 1, wherein the cap comprises nitride.

13. The semiconductor process according to claim 1, wherein the cap is exposed while the spacer and the block are formed.

14. The semiconductor process according to claim 1, further comprising:
   removing the material after pulling down the block, the spacer and the material.

15. The semiconductor process according to claim 14, wherein the material is removed by an oxygen containing process.

16. The semiconductor process according to claim 15, wherein the oxygen containing process comprises an O2 plasma process.

17. The semiconductor process according to claim 1, further comprising:
   forming a second gate on the substrate while the first gate is formed, in order to form the assisting gate between the first gate and the second gate.

18. The semiconductor process according to claim 17, wherein the second gate has the same structure as the first gate.

\* \* \* \* \*